(12) United States Patent
Park et al.

(10) Patent No.: US 7,990,340 B2
(45) Date of Patent: Aug. 2, 2011

(54) PLASMA DISPLAY APPARATUS

(75) Inventors: Hyun Il Park, Sungnam-si (KR); Chang Young Kwon, Pohang-si (KR); Yun Kwon Jung, Gumi-si (KR); Jong Sik Lim, Daegu-si (KR); Kyu Choon Cho, Yongin-si (KR); Yang Ki An, Kyungsagbuk-do (KR)

(73) Assignee: LG Electronics Inc., Seoul (KR)

( * ) Notice: Subject to any disclaimer, the term of this patent is extended or adjusted under 35 U.S.C. 154(b) by 1302 days.

(21) Appl. No.: 11/594,333

(22) Filed: Nov. 8, 2006

(65) Prior Publication Data

US 2007/0222709 A1    Sep. 27, 2007

(30) Foreign Application Priority Data

Mar. 23, 2006 (KR) .................. 10-2006-0026614

(51) Int. Cl.
*G09G 3/28* (2006.01)
(52) U.S. Cl. .............. 345/60; 345/156; 345/61; 345/62; 345/63
(58) Field of Classification Search ............... 345/60–63
See application file for complete search history.

(56) References Cited

U.S. PATENT DOCUMENTS

| | | | |
|---|---|---|---|
| 2003/0137254 A1 * | 7/2003 | Bang | 315/169.3 |
| 2005/0146456 A1 | 7/2005 | Kondo | 341/162 |

FOREIGN PATENT DOCUMENTS

| | | |
|---|---|---|
| DE | 39 365 44 A1 | 6/1990 |
| JP | 06-348220 | 12/1994 |
| KR | 10/2001-0028539 A | 4/2001 |

OTHER PUBLICATIONS

European Search Report dated Apr. 25, 2008.
Korean Office Action dated May 31, 2007.

* cited by examiner

*Primary Examiner* — Richard Hjerpe
*Assistant Examiner* — Leonid Shapiro
(74) *Attorney, Agent, or Firm* — KED & Associates, LLP

(57) ABSTRACT

The present invention relates to a plasma display apparatus including a sustain driving apparatus that supplies a sustain signal to a panel. The plasma display apparatus includes a panel in which a front substrate having formed first and second electrodes therein and a rear substrate are coalesced, a sustain driver including a first switch for applying a first voltage to any one of the first and second electrodes and a second switch for applying a second voltage, and a circuit protection unit that controls one of the first and second switches, which has a voltage higher than a predetermined voltage, at its both ends, not to turn on. According to the present invention, when a voltage at both ends of the switch included in the sustain driving apparatus in order to supply the sustain signal is higher than a reference voltage, the switch is controlled not to turn on. It is therefore possible to prevent damage due to the short of the sustain driving apparatus and, therefore, to improve the lifespan and reliability of a product.

17 Claims, 10 Drawing Sheets

PLASMA DISPLAY APPARATUS

This application claims the benefit of Korean Patent Application No. 10-2006-0026614 filed on Mar. 23, 2006, which is hereby incorporated by reference for all purposes as if fully set forth herein.

BACKGROUND OF THE INVENTION

1. Field of the Invention

The present invention relates, in general, to a plasma display apparatus and, more particularly, to a sustain driving apparatus that supplies a sustain signal to a plasma display panel.

2. Background of the Related Art

A plasma display panel (hereinafter, referred to as "PDP") is adapted to display an image by exciting phosphors by vacuum ultraviolet rays (VUV) generated during the discharge of a mixed inert gas.

The PDP is advantageous in that it can be made large and thin and can be easily fabricated due to its simple structure, and also has high luminance and emission efficiency compared to other flat display devices. More particularly, an AC surface discharge type three-electrode PDP has the advantages of a lower driving voltage and a longer lifespan since wall charges accumulated on a surface during a discharge protect electrodes from sputtering generated by the discharge.

To implement gray levels of an image, the PDP is driven with one frame being time-divided into a reset period for initializing the entire cells, an address period for selecting cells, and a sustain period for generating a display discharge on selected cells.

That is, one frame period is divided into several subfields having a different number of sustain discharges depending on luminance weights. Each subfield is divided into a reset period, an address period, and a sustain period.

FIG. 1 is a block diagram of a general PDP driving apparatus. The driving apparatus includes a sustain driver 3, an address driver 4, and a scan driver 5.

A panel 1 includes scan electrodes Y1 to Yn and sustain electrodes Z1 to Zn, which are alternately disposed horizontally, and address electrodes X1 to Xm disposed vertically. The scan electrodes Y1 to Yn are generally used to scan the screen and sustain a discharge, the sustain electrodes Z1 to Zn are generally used to sustain a discharge, and the address electrodes X1 to Xm are generally used to input data.

The scan driver 5 supplies a sustain signal for sustaining a discharge of a cell, an erase signal for stopping a discharge of a discharged cell, a scan signal synchronized with a video data signal applied to the address electrodes X1 to Xm, and so on to the respective scan electrodes Y1 to Yn. Furthermore, the sustain driver 3 commonly supplies a sustain signal, etc. to the sustain electrodes Z1 to Zn, and the address driver 4 supplies the data signal to each of the address electrodes X1 to Xm.

The sustain discharge of the AC surface discharge type PDP driven as described above requires a high voltage. Therefore, an energy recovery apparatus that recovers a voltage between the scan electrode Y and the sustain electrode Z and supplies the recovered voltage as a driving voltage of a next discharge is used.

FIG. 2 is a circuit diagram of a general sustain driving apparatus including the energy recovery apparatus. The sustain driving apparatus includes an energy recovery unit 10 and a sustain driver 20.

The energy recovery unit 10 includes a source capacitor Cs, an inductor L, a first switch Q1 for supplying energy stored in the source capacitor Cs to a panel, and a second switch Q2 for recovering energy from the panel.

The sustain driver 20 includes a third switch Q3 for applying a sustain voltage Vs to the panel, and a fourth switch Q4 for dropping a voltage of the panel to a ground voltage GND.

It is required that when the sustain voltage Vs is applied to the panel, only the third switch Q3 be turned on, and when the ground voltage GND is applied to the panel, only the fourth switch Q4 be turned on. However, the third and fourth switches Q3 and Q4 may be turned on or off at the same time, or when the sustain voltage Vs is applied to the panel, the fourth switch Q4 may be turned on or when the ground voltage GND is applied to the panel, the third switch Q3 may be turned on, due to the error of the PDP driving apparatus, and/or so on. If such error occurs, the lifespan of a product is shortened due to the short since the first switches Q3 and Q4 are damaged. Furthermore, a problem arises because severe noise is generated.

SUMMARY OF THE INVENTION

Accordingly, the present invention has been made in view of the above problems occurring in the prior art, and it is an object of the present invention to provide a plasma display apparatus, in which it can prevent damage to circuits due to the malfunction of switches and has mounted a reliable driving circuit therein in a sustain driving apparatus of the plasma display apparatus.

To achieve the above object, according to an aspect of the present invention, there is provided a plasma display apparatus, including a panel in which a front substrate having formed first and second electrodes therein and a rear substrate are coalesced, a sustain driver including a first switch for applying a first voltage to any one of the first and second electrodes and a second switch for applying a second voltage, and a circuit protection unit that controls one of the first and second switches, which has a voltage higher than a predetermined voltage, at its both ends, not to turn on.

Preferably, the panel may include a front substrate, the first and second electrode formed on the front substrate, a rear substrate, a third electrode formed on the rear substrate, and barrier ribs formed over the rear substrate, for partitioning a plurality of discharge cells.

The predetermined voltage may be ¼ or less of a sustain voltage. The circuit protection unit may control the turn-on of the first and second switches according to an amount of a sustain signal applied to any one of the first and second electrodes.

Preferably, the circuit protection unit may control the first switch not to turn on when the amount of the sustain signal is lower than a third voltage, and controls the second switch not to turn on when the amount of the sustain signal is higher than the third voltage.

The circuit protection unit may include an OP amp for comparing the amount of the sustain signal and the third voltage. The third voltage may be set in a range of ¼ to ¾ of a sustain voltage.

The circuit protection unit may control the first switch not to turn on when a voltage at both ends of the first switch is higher than a fourth voltage, and controls the second switch not to turn on when a voltage at both ends of the second switch is higher than a fifth voltage.

Preferably, the circuit protection unit may include an OP amp for comparing a voltage at both ends of each of the first and second switches and the predetermined voltage.

At least one of the first and second switches may be a FET (Field Effect Transistor). It is preferred that the circuit protection unit preclude a voltage input to a gate of the FET when a drain-source voltage of the FET is higher than the predetermined voltage.

According to another aspect of the present invention, there is provided a plasma display apparatus, including a sustain driver including a first switch for applying a sustain signal to a plasma display panel and a first voltage to the panel, and a second switch for applying a second voltage to the panel; a control unit that generates a first control signal to control the turn on/off of the first switch and a second control signal to control the turn on/off of the second switch and outputs the first and second control signals to the sustain driver; and a circuit protection unit that controls the first switch not to turn on when an amount of the sustain signal is smaller than a third voltage and controls the second switch not to turn on when the amount of the sustain signal is greater than the third voltage.

Preferably, the circuit protection unit may include a comparator that compares the amount of the sustain signal and the third voltage, a first inverter that inverts the comparator output signal, a first NAND gate that receives the first inverter output signal and the first control signal as inputs, a second inverter that inverts the first NAND gate output signal and outputs the inverted signal to the first switch; a second NAND gate that receives the second comparator output signal and the second control signal as inputs, and a third inverter that inverts the second NAND gate output signal and outputs the inverted signal to the second switch.

The comparator may include a fourth inverter that inverts the sustain signal, and a fifth inverter that inverts the fourth inverter output signal. It is preferred that the fourth and fifth inverters have a predetermined threshold voltage.

The comparator may include a third NAND gate using the sustain signal as two inputs, and a fourth NAND gate using the third NAND gate output signal as two inputs. It is preferred that the third and four NAND gates have a predetermined threshold voltage.

The comparator may further include a scale adjustment unit that scales down the sustain signal and outputs the resulting signal to the fourth inverter. The scale adjustment unit may include a plurality of resistors for scaling down the sustain signal, and a diode connected between both ends of at least one of the plurality of resistors.

Preferably, the comparator may further include a resistor connected between both ends of the fourth inverter. The comparator may further include a resistor connected between the fourth inverter and the fifth inverter.

The plasma display apparatus may further include an energy recovery unit that recovers and stores energy supplied to the panel. The energy recovery unit may include a source capacitor, third and fourth switches that respectively control energy supply and recovery between the source capacitor and the panel, and an inductor that forms a resonant circuit together with the source capacitor and a capacitor of the panel.

Preferably, the sustain driver may further include a sustain voltage source that supplies a sustain voltage. The first switch may be turned on after energy is supplied to the panel by the energy recovery unit, so that the first voltage is applied to the panel. The second switch may be turned on after energy is recovered from the panel by the energy recovery unit, so that the second voltage is applied to the panel.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

A plasma display apparatus according to the present invention will now be described in detail with reference to the accompanying drawings.

It is however to be noted that the plasma display apparatus of the present invention is not limited to the following embodiments, but may include a number of other embodiments.

Figure 1:
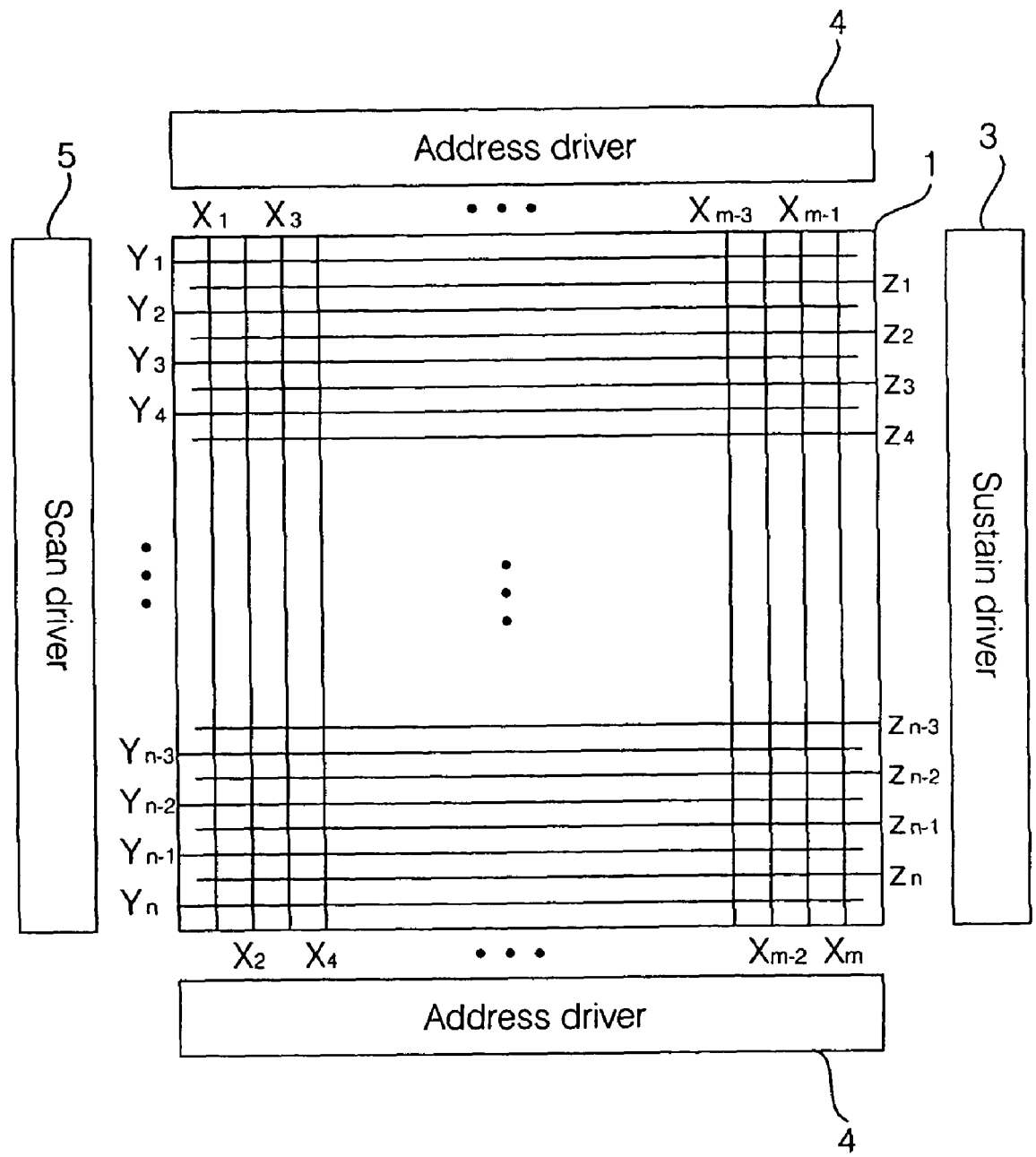
FIG. 1 is a block diagram of a general panel driving apparatus included in a plasma display apparatus.
Figure 2:
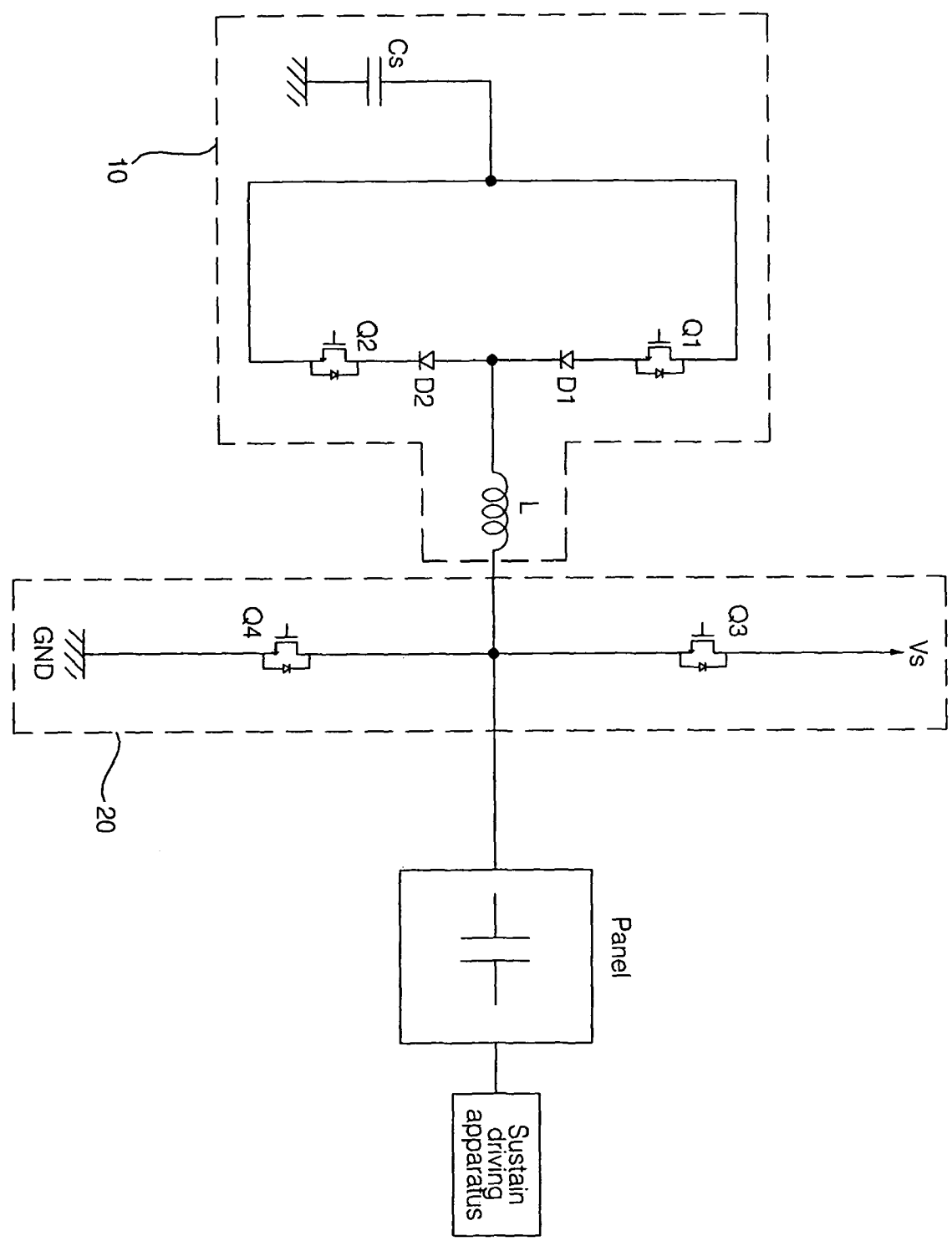
FIG. 2 is a circuit diagram of a general sustain driving apparatus included in the plasma display apparatus.
Figure 3:
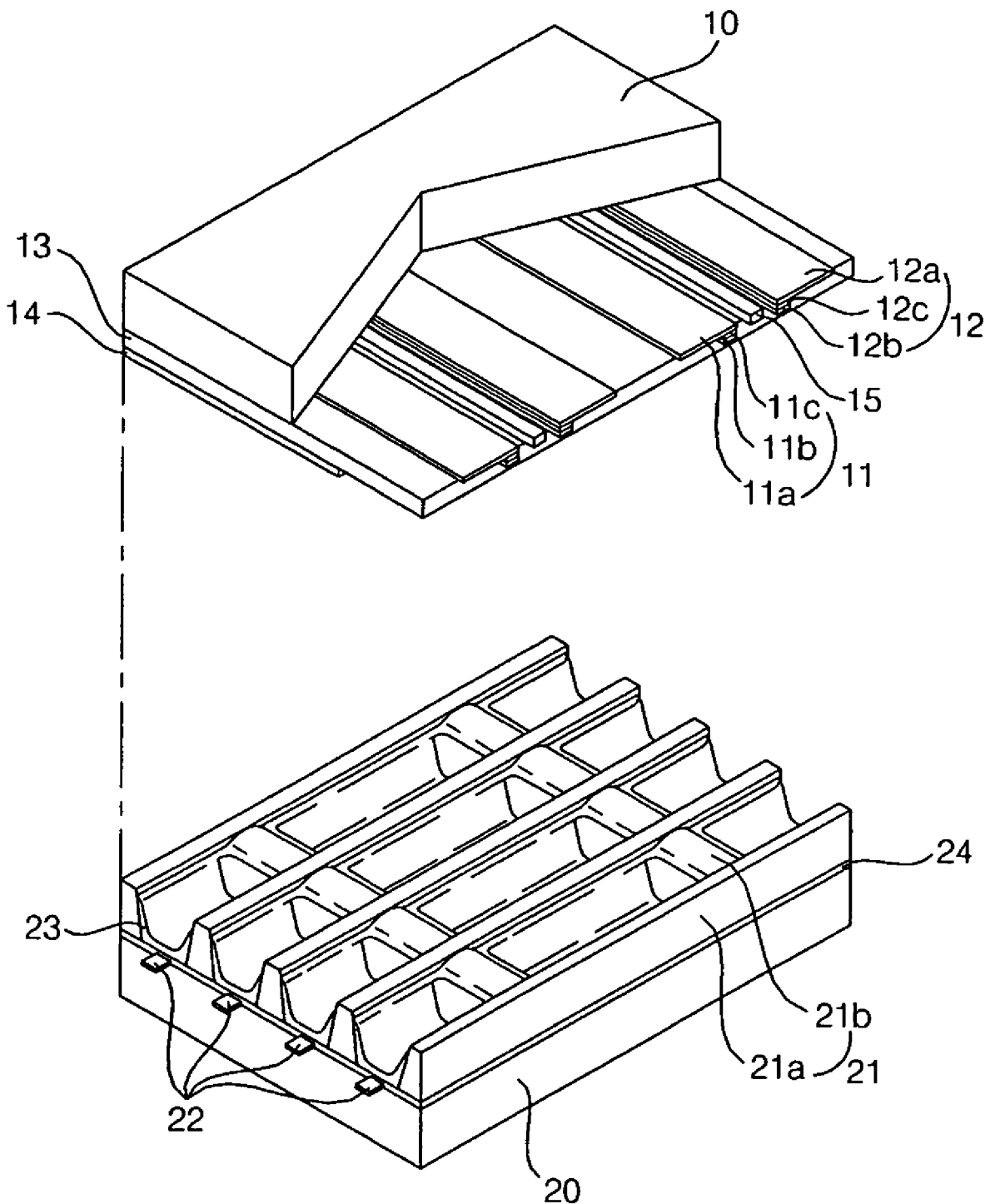
FIG. 3 is a perspective view showing an embodiment of a PDP structure according to the present invention.

Hereinafter, the plasma display apparatus according to the present invention will be described in detail with reference to FIGS. 3 to 11. FIG. 3 is a perspective view showing an embodiment of a PDP structure according to the present invention.

As shown in FIG. 3, the PDP includes a scan electrode 11 and a sustain electrode 12 (i.e., a sustain electrode pair) formed on a front substrate 10, and address electrodes 22 formed on a rear substrate 20.

The sustain electrode pair 11 and 12 includes transparent electrodes 11a and 12a, which are generally formed of Indium-Tin-Oxide (ITO), and bus electrodes 11b and 12b. The bus electrodes 11b and 12b may be formed using metal, such as silver (Ag) or chrome (Cr), a stack of Cr/copper (Cu)/Cr, or a stack of Cr/aluminum (Al)/Cr. The bus electrodes 11b and 12b are formed on the transparent electrodes 11a and 12a and serve to reduce a voltage drop caused by the transparent electrodes 11a and 12a having a high resistance.

Meanwhile, the sustain electrode pair 11 and 12 according to the present invention may have a structure in which the transparent electrodes 11a and 12a and the bus electrodes 11b and 12b are laminated, or include only the bus electrodes 11b and 12b without the transparent electrodes 11a and 12a. Such a structure is advantageous in that it can save the manufacturing cost of the panel because it does not require the transparent electrodes 11a and 12a. The bus electrodes 11b and 12b used in the structure may also be formed using a variety of materials, such as a photosensitive material, other than the above-mentioned materials.

Black matrices (BM) 15 are arranged between the transparent electrodes 11a and 12a and the bus electrodes 11b and 12b of the scan electrode 11 and the sustain electrode 12. The black matrices 15 has a light-shielding function of reducing the reflection of external light generated outside the front substrate 10 by absorbing the external light and a function of improving the purity and contrast of the front substrate 10.

The black matrices 15 according to the present invention are formed in the front substrate 10. Each of the black matrices 15 may include a first black matrix 15 formed at a location at which it is overlapped with a barrier rib 21, and second black matrices 11c and 12c formed between the transparent electrodes 11a and 12a and the bus electrodes 11b and 12b. The first black matrix 15, and the second black matrices 11c and 12c, which are also referred to as a "black layer" or a "black electrode layer", may be formed at the same time and be connected physically, or may be formed separately and not be connected physically.

In the case where the first black matrix 15 and the second black matrices 11c and 12c are connected physically, the first black matrix 15 and the second black matrices 11c and 12c may be formed using the same material. However, in the case where the first black matrix 15 and the second black matrices 11c and 12c are not connected physically, the first black matrix 15 and the second black matrices 11c and 12c may be formed using different materials.

An upper dielectric layer 13 and a protection layer 14 are laminated on the front substrate 10 in which the scan electrodes 11 and the sustain electrodes 12 are formed in parallel. Charged particles generated by a discharge are accumulated on the upper dielectric layer 13. The upper dielectric layer 13 can serve to protect the sustain electrode pair 11 and 12. The protection layer 14 serves to protect the upper dielectric layer 13 from sputtering of charged particles generated during the discharge of a gas and also to increase emission efficiency of secondary electrons.

Furthermore, the address electrodes 22 are formed in a direction to cross the scan electrodes 11 and the sustain electrodes 12. Lower dielectric layers 23 and barrier ribs 21 are also formed on the rear substrate 20 in which the address electrodes 22 are formed.

A phosphor layer is formed on the lower dielectric layers 23 and the surfaces of the barrier ribs 21. Each of the barrier ribs 21 includes a longitudinal barrier rib 21a and a traverse barrier rib 21b, which are formed in closed form. The barrier ribs 21 serve to separate discharge cells physically and to prevent ultraviolet rays generated by a discharge and a visible ray from leaking to neighboring discharge cells.

The present embodiment of the present invention may be applied to not only the structure of the barrier rib 21 shown in FIG. 3, but also barrier rib structures having a variety of shapes. For example, the present embodiment of the present invention may include a differential type barrier rib structure in which the longitudinal barrier rib 21a and the traverse barrier rib 21b have different height, a channel type barrier rib structure in which a channel that can be used as an exhaust passage is formed in at least one of the longitudinal barrier rib 21a and the traverse barrier rib 21b, a hollow type barrier rib structure in which a hollow is formed in at least one of the longitudinal barrier rib 21a and the traverse barrier rib 21b.

In the differential type barrier rib structure, it is preferred that the traverse barrier rib 21b have a higher height. In the channel type barrier rib structure or the hollow type barrier rib structure, it is preferred that a channel or a hollow be formed in the traverse barrier rib 21b.

Meanwhile, in an embodiment of the present invention, it has been shown and described that the R, G, and B discharge cells are arranged on the same line. However, the R, G, and B discharge cells may be arranged in different forms. For example, the R, G, and B discharge cells may have a delta type arrangement in which they are arranged in a triangle. Furthermore, the discharge cells may be arranged in a variety of forms, such as square, pentagon and hexagon.

Furthermore, the phosphor layer is emitted by ultraviolet rays generate during the discharge of a gas to generate any one visible ray of red (R), green (G) and blue (B). Discharge spaces provided between the upper/rear substrates 10 and 20 and the barrier ribs 21 are injected with a mixed inert gas, such as He+Xe, Ne+Xe or He+Ne+Xe. To improve the luminance, the content of Xe of the discharge gas may be set to 8% or more, preferably 10% or more.

Figure 4:
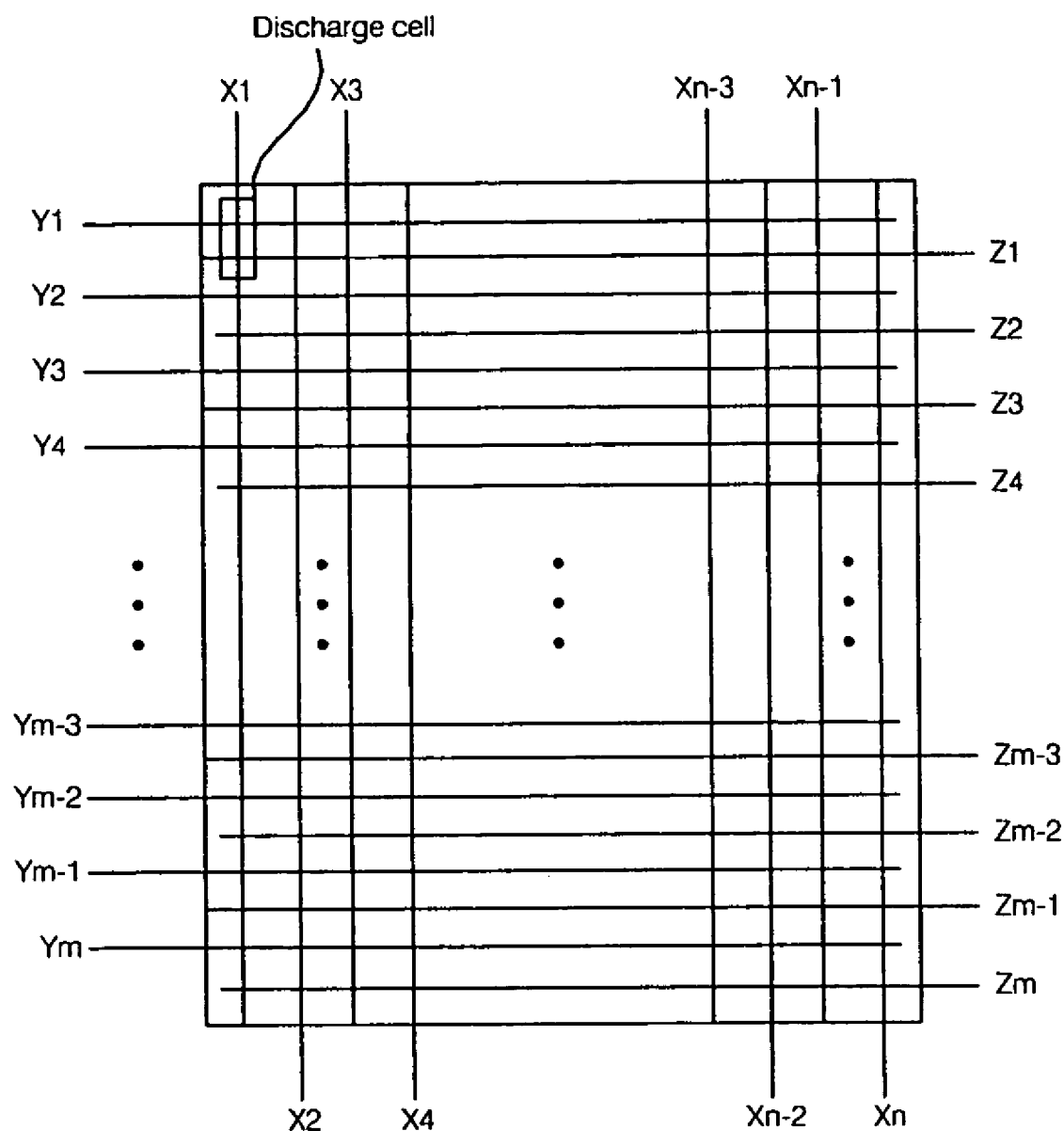
FIG. 4 is a cross-sectional view showing an embodiment of the electrode arrangement of the PDP.

FIG. 4 is a cross-sectional view showing an embodiment of the electrode arrangement of the PDP. It is preferred that a plurality of discharge cells constituting the PDP be arranged in matrix form, as shown in FIG. 4. The plurality of discharge cells are respectively disposed at the intersections of scan electrode lines Y1 to Ym, sustain electrodes line Z1 to Zm, and address electrodes lines X1 to Xn. The scan electrode lines Y1 to Ym may be driven sequentially or at the same time. The sustain electrode lines Z1 to Zm may be driven at the same time. The address electrode lines X1 to Xn may be driven with them being divided into even-numbered lines and odd-numbered lines or may be driven sequentially.

The electrode arrangement shown in FIG. 4 is only an embodiment of the electrode arrangement of the PDP according to the present invention. Therefore, the present invention is not limited to the electrode arrangement and driving method of the PDP shown in FIG. 4. For example, the present invention may be applied to a dual scan method in which two of the scan electrode lines Y1 to Ym are driven at the same time. Furthermore, the address electrode lines X1 to Xn may be driven with them being divided into upper and lower parts at the center of the panel.

Figure 5:
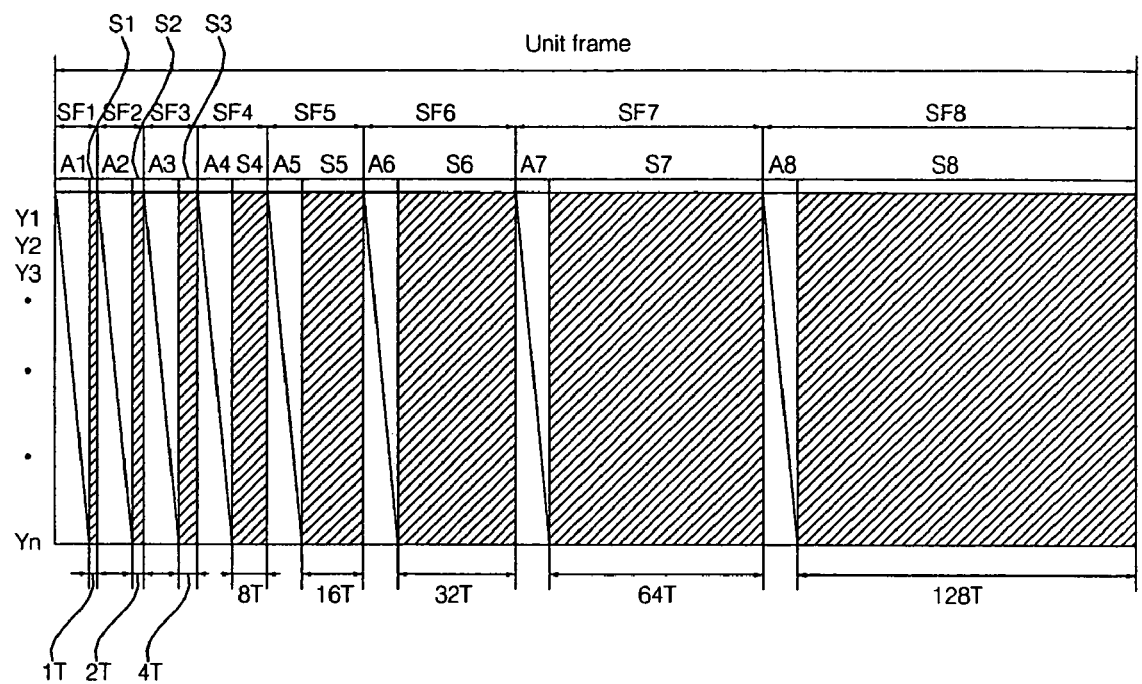
FIG. 5 is a timing diagram showing an embodiment of a method of time-driving the PDP with one frame being divided into a plurality of subfields.

FIG. 5 is a timing diagram showing an embodiment of a method of time-driving the PDP with one frame being divided into a plurality of subfields.

A unit frame may be divided into a predetermined number (for example, eight subfields SF1, . . . , SF8) in order to realize time-divided gray level display. Furthermore, each of the subfields SF1, . . . , SF8 is divided into a reset period (not shown), address periods A1, . . . , A8, and sustain periods S1, . . . , S8.

In accordance with an embodiment of the present invention, the reset period may be omitted from at least one of the plurality of subfields. For example, the reset period may exist only in the first subfield or may exist only in a subfield approximately located between the first subfield and the whole subfield.

In each of the address periods A1, . . . , A8, a display data signal is applied to address electrodes X and scan pulses corresponding to respective scan electrodes Y are sequentially applied to the address electrodes X.

In each of the sustain periods S1, . . . , S8, a sustain pulse is alternately applied to the scan electrode Y and a sustain electrode Z. Accordingly, a sustain discharge is generated in discharge cells on which wall charges are formed in the address periods A1, . . . , A8.

The luminance of the PDP is proportional to the number of sustain discharge pulses within the sustain periods S1, . . . , S8 occupied in the unit frame. In the case where one frame forming one image is represented by eight subfields and 256 gray levels, a different number of sustain pulses may be sequentially allocated to the respective subfields in the ratio of 1, 2, 4, 8, 16, 32, 64, and 128. In order to obtain luminance of 133 gray levels, a sustain discharge can be generated by addressing cells during the subfield1 period, the subfield3 period, and the subfield8 period.

The number of sustain discharges allocated to each subfield may be decided depending on the weights of subfields in accordance with an APC (Automatic Power Control) step. That is, an example in which one frame is divided into eight subfields has been described with reference to FIG. 16. However, the present invention is not limited to the above example, but the number of subfields forming one frame may be varied depending on the design specifications. For example, a PDP may be driven by dividing one frame into eight or more subfields, such as 12 or 16 subfields.

Furthermore, the number of sustain discharges allocated to each subfield may be changed in various ways in consideration of a gamma characteristic or a panel characteristic. For example, the degree of a gray level allocated to the subfield4 can be lowered from 8 to 6 and the degree of a gray level allocated to the subfield6 can be lowered from 32 to 34.

Figure 6:
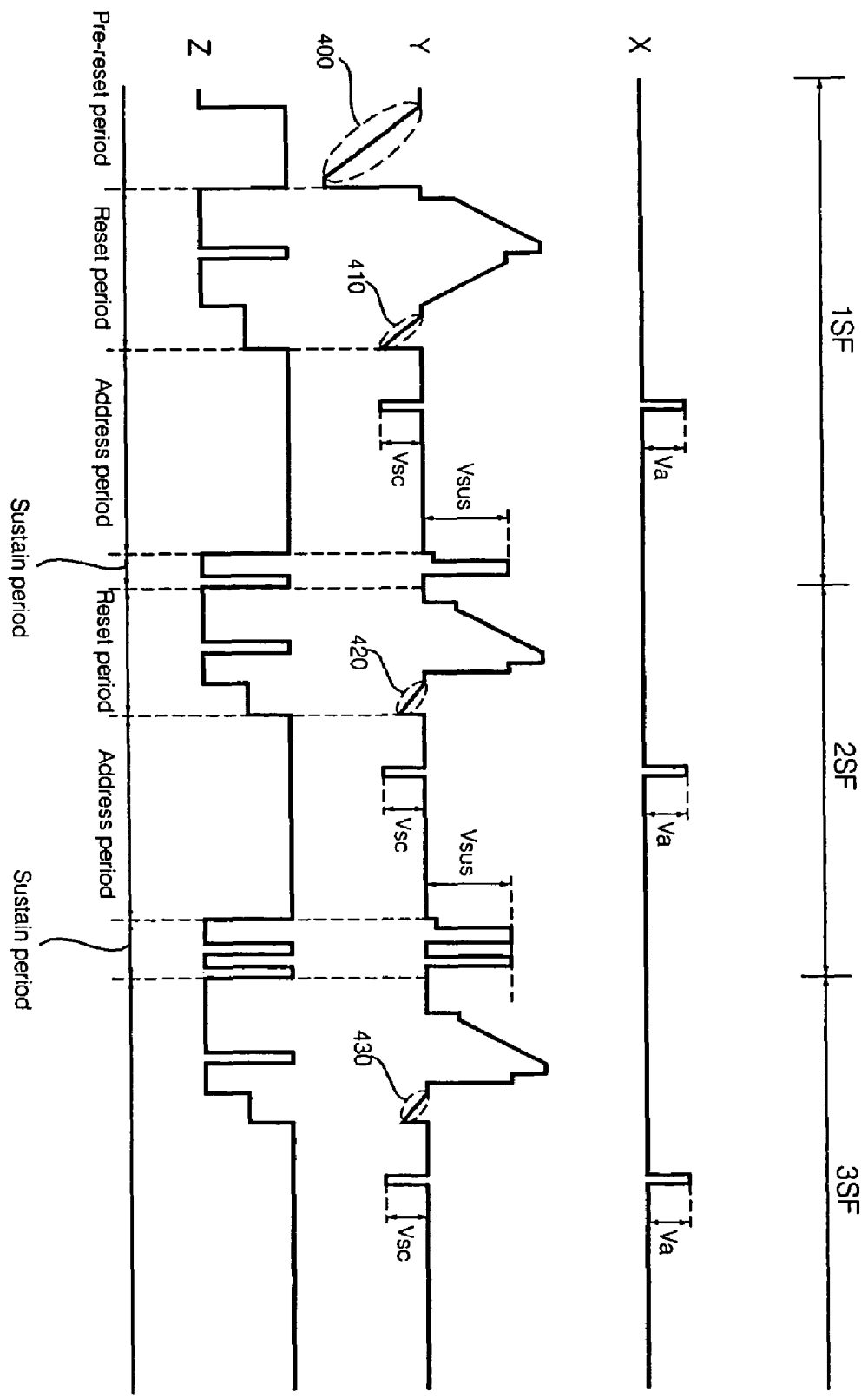
FIG. 6 is a timing diagram showing an embodiment of driving signals for driving the PDP.

FIG. 6 is a timing diagram showing an embodiment of driving signals for driving the PDP.

Each subfield includes a pre-reset period for forming positive wall charges on the scan electrode Y and negative wall charges on the sustain electrode Z, a reset period for initializing discharge cells of the whole screen using wall charge distributions formed by the pre-reset period, an address period for selecting discharge cells, and a sustain period for sustaining the discharge of selected discharge cells.

The reset period includes a setup period and a set-down period. In the setup period, a ramp-up waveform ramp-up is applied to all the scan electrodes at the same time. Therefore, a minute discharge is generated in the entire discharge cell and wall charges are generated accordingly. In the set-down period, a ramp-down waveform ramp-down, which falls from a positive voltage lower than a peak voltage of the ramp-up waveform, is applied to the entire scan electrodes Y at the same time. Therefore, an erase discharge is generated in the entire discharge cells, thereby erasing unnecessary charges from the wall charges generated by the set-up discharge and spatial charges. In the reset period, the sustain electrode Z may be supplied with a sustain fall signal. The sustain fall signal may be applied before the setup period is ended. In other words, the sustain fall signal may be applied before the setup period begins. It is preferable that the width of the sustain fall signal be smaller than the greatest pulse width of the sustain signal applied to at least one of the scan electrode and the sustain electrode in the sustain period posterior to the reset period.

In the address period, a scan signal scan having a negative voltage Vsc is sequentially applied to the scan electrodes, and at the same time, an address signal data having a positive voltage Va is applied to the address electrode X. Therefore, an address discharge is generated due to a voltage difference between the scan signal scan and the data signal data and a wall voltage generated during the reset period, so that cells are selected. Meanwhile, during the set-down period and the address period, a signal to sustain a sustain voltage is applied to the sustain electrode.

In the sustain period, a sustain pulse having a sustain voltage Vsus is alternately applied to the scan electrode and the sustain electrode. Accordingly, a sustain discharge is generated between the scan electrode and the sustain electrode in a surface discharge form.

The driving waveforms shown in FIG. 6 are a first embodiment of signals for driving the PDP according to the present invention. The present invention is not limited to the waveforms shown in FIG. 6. For example, the pre-reset period may be omitted, the polarities and voltage levels of the driving signals shown in FIG. 6 may be changed, if needed, and an erase signal for erasing wall charges may be applied to the sustain electrode after the sustain discharge is completed. The present invention may also be applied to a single sustain driving method in which the sustain signal is applied to either the scan electrode Y or the sustain electrode Z, generating a sustain discharge.

Figure 7:
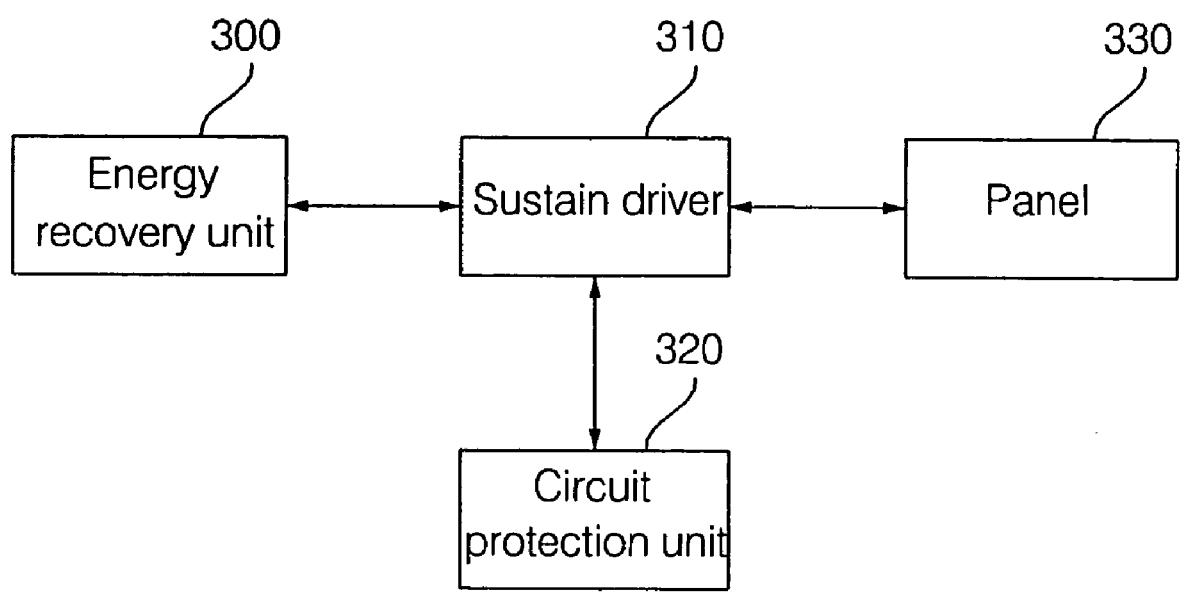
FIG. 7 is a block diagram showing an overall construction of a sustain driving apparatus according to the present invention.

FIG. 7 is a block diagram showing an overall construction of the sustain driving apparatus according to the present invention. The sustain driving apparatus includes an energy recovery unit 300, a sustain driver 310, and a circuit protection unit 320.

The energy recovery unit 300 supplies energy to a panel 330, recovers energy generated by a discharge from the panel 330, and stores the recovered energy. The sustain driver 310 supplies a signal having the sustain voltage Vs to the panel 330. The circuit protection unit 320 controls circuits of the sustain driver 310 not to be short.

Figure 8:
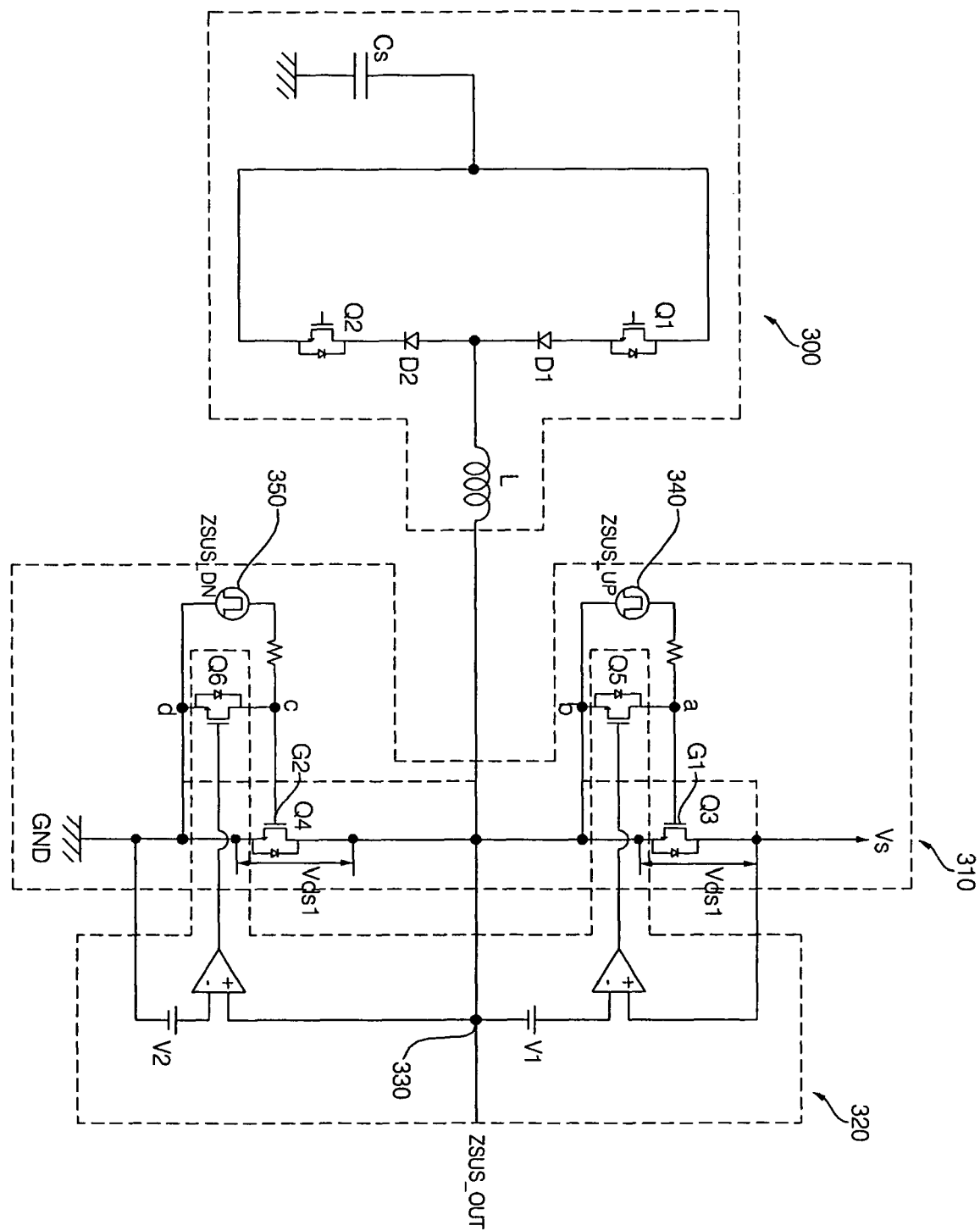
FIG. 8 is a circuit diagram showing an embodiment of the construction of the sustain driving apparatus.

FIG. 8 is a detailed circuit diagram of the sustain driving apparatus. The energy recovery unit 300 includes an inductor L that is connected between the panel and a source capacitor Cs and forms a resonance circuit together with the panel, and first and second switches Q1 and Q2 connected in parallel between the source capacitor Cs and the inductor L. The source capacitor Cs recovers a voltage charged into the panel capacitor at the time of a sustain discharge, charges the recovered voltage, and supplies the charged voltage to the panel capacitor again.

The sustain driver 310 includes a third switch Q3, which is connected in parallel between the inductor L and the panel and is also connected to a sustain voltage source Vs, and a fourth switch Q4 that is connected to a ground GND and is turned on to drop a voltage of the panel to a ground voltage. The third switch Q3 is turned on to supply a sustain voltage.

Furthermore, the circuit protection unit 320 is connected to the sustain driver 310 and the panel, and includes two comparators OP1 and OP2, two reference voltage sources V1 and V2, and switches Q5 and Q6. It is preferred that the comparators be an OP amp as shown in FIG. 8.

The reference voltage source V1 is disposed between a sustain output terminal ZSUS_OUT and an inverting terminal—of the comparator OP1. The comparator OP1 compares the reference voltage V1 and a drain-source voltage Vds1 of the third switch. The fifth switch Q5 is connected to an output terminal of the comparator OP1 and is turned on or off according to the output of the comparator OP1.

If the drain-source voltage Vds1 of the third switch Q3 is higher than the reference voltage V1, the comparator OP1 applies a signal to the fifth switch Q5 and turns on the fifth switch Q5. If the fifth switch Q5 is turned on, "a-b" becomes short. As a result, a driving signal ZSUS_UP is not applied to a gate G1 of the third switch Q3, and the gate-source voltage becomes 0V and is not turned on. In accordance with the above operation, when the drain-source voltage Vds1 of the third switch Q3 is higher than the reference voltage V1, the third switch Q3 is controlled such that it is not turned on regardless of the driving signal ZSUS_UP. It is therefore possible to prevent the third switch Q3 from being short due to a malfunction.

Furthermore, the second reference voltage source V2 is disposed between the ground GND and an inverting terminal—of the second comparator OP2. The second comparator OP2 compares the second reference voltage V2 and a drain-source voltage Vds2 of the fourth switch Q4. The sixth switch Q6 is connected to an output terminal of the second comparator OP2 and is turned on or off according to the output of the second comparator OP2.

If the drain-source voltage Vds2 of the fourth switch Q4 is higher than the second reference voltage V2, the second comparator OP2 applies a signal to the sixth switch Q6 and turns on the sixth switch Q6. If the sixth switch Q6 is turned on, "c-d" becomes short. Accordingly, a gate G2 of the fourth switch Q4 is not applied with a driving signal ZSUS_DN, and the gate-source voltage becomes 0V and is not turned on accordingly. In accordance with the above operation, when the drain-source voltage Vds2 of the fourth switch Q4 is higher than the second reference voltage V2, the fourth switch Q4 is controlled such that it is not turned on regardless of the driving signal ZSUS_DN. It is therefore possible to prevent the fourth switch Q4 from being short due to a malfunction.

It is preferred that the reference voltage V1 and the second reference voltage V2 be set to ¼ or more and ¾ or less, of the sustain voltage Vs.

That is, the circuit protection unit 320 controls the third switch Q3 not to turn on when an output voltage supplied to the panel is a low voltage similar to the ground voltage and also controls the fourth switch Q4 not to turn on when a sustain output is a high voltage similar to the sustain voltage Vs, so that damage to circuits is not generated due to a malfunction of the switches.

Figure 9:
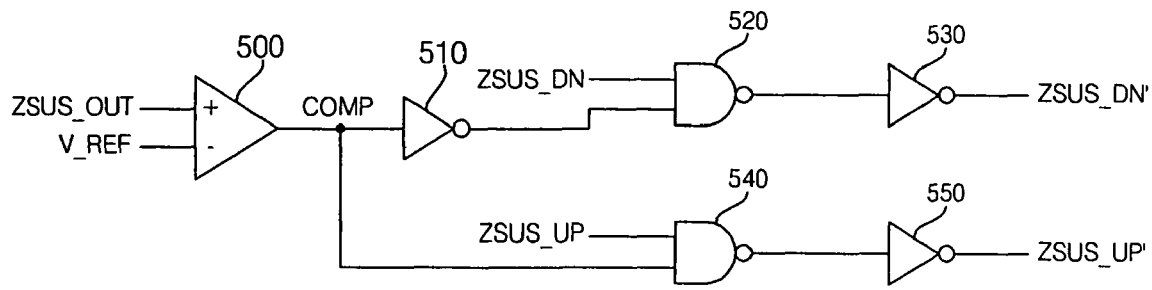
FIG. 9 is a circuit diagram showing an embodiment of the construction of a circuit protection unit shown in FIG. 7.

FIG. 9 is a circuit diagram showing an embodiment of the construction of the circuit protection unit 320 shown in FIG. 7. The circuit protection unit 320 includes a comparator 500, two NAND gates 520 and 540, and three inverters 510, 530, and 550.

The comparator 500 compares the output voltage ZSUS_OUT of the sustain driving apparatus, which is supplied to the panel, and a reference voltage V_REF, and outputs a comparison result as a signal COMP. If the output voltage ZSUS_OUT is higher than the reference voltage V_REF, the comparator 500 may preferably output a High signal. In this case, an output of the first inverter 510, which is input to the NAND gate 520, becomes Low and an output of the NAND gate 520 becomes High regardless of the driving signal (ZSUS_DN) value of the fourth switch Q4. Therefore, a driving signal ZSUS_DN' that will be actually input to the fourth switch Q4 becomes Low regardless of the driving signal (ZSUS_DN) value of the fourth switch Q4. That is, the circuit protection unit 320 receives the driving signal ZSUS_DN for turning on or off the fourth switch Q4, converts the received signal into a new driving signal ZSUS_DN', and supplies the converted signal to the fourth switch Q4.

In accordance with the above-described operation, if the output voltage ZSUS_OUT of the driving apparatus is higher than the reference voltage V_REF and a voltage higher than the reference voltage V_REF is applied between the drain-source of the fourth switch Q4 accordingly, the circuit protection unit 320 maintains the driving signal ZSUS_DN' of the fourth switch Q4 to a low level regardless of the input driving signal ZSUS_DN so that the fourth switch Q4 is turned on and becomes short.

Furthermore, it is preferred that the comparator 500 output a low signal when the output voltage ZSUS_OUT is lower than the reference voltage V_REF. In this case, the output of the second NAND gate 540 becomes High with no regard to the driving signal (ZSUS_UP) value of the third switch Q3 and a driving signal ZSUS_UP', which will be actually input to the third switch Q3, becomes Low regardless of the driving signal (ZSUS_UP) value of the third switch Q3. That is, the circuit protection unit 320 receives the driving signal ZSUS_UP for turning on or off the third switch Q3, converts the received signal into a new driving signal ZSUS_UN', and supplies the converted signal to the third switch Q3.

In accordance with the above-described operation, if the output voltage ZSUS_OUT of the driving apparatus is lower than the reference voltage V_REF and a voltage greater than a difference (Vs-V_REF) between the sustain voltage Vs and the reference voltage V_REF is applied between the drain-source of the third switch Q3 accordingly, the circuit protection unit 320 maintains the driving signal ZSUS_UP' of the third switch Q3 to a low level regardless of the input driving signal ZSUS_UP so that the third switch Q3 is turned on and becomes short.

It is preferred that the output voltage ZSUS_OUT of the driving apparatus be scaled down in line with an operating voltage of the OP amp and be then input to the comparator 500.

Figure 10:
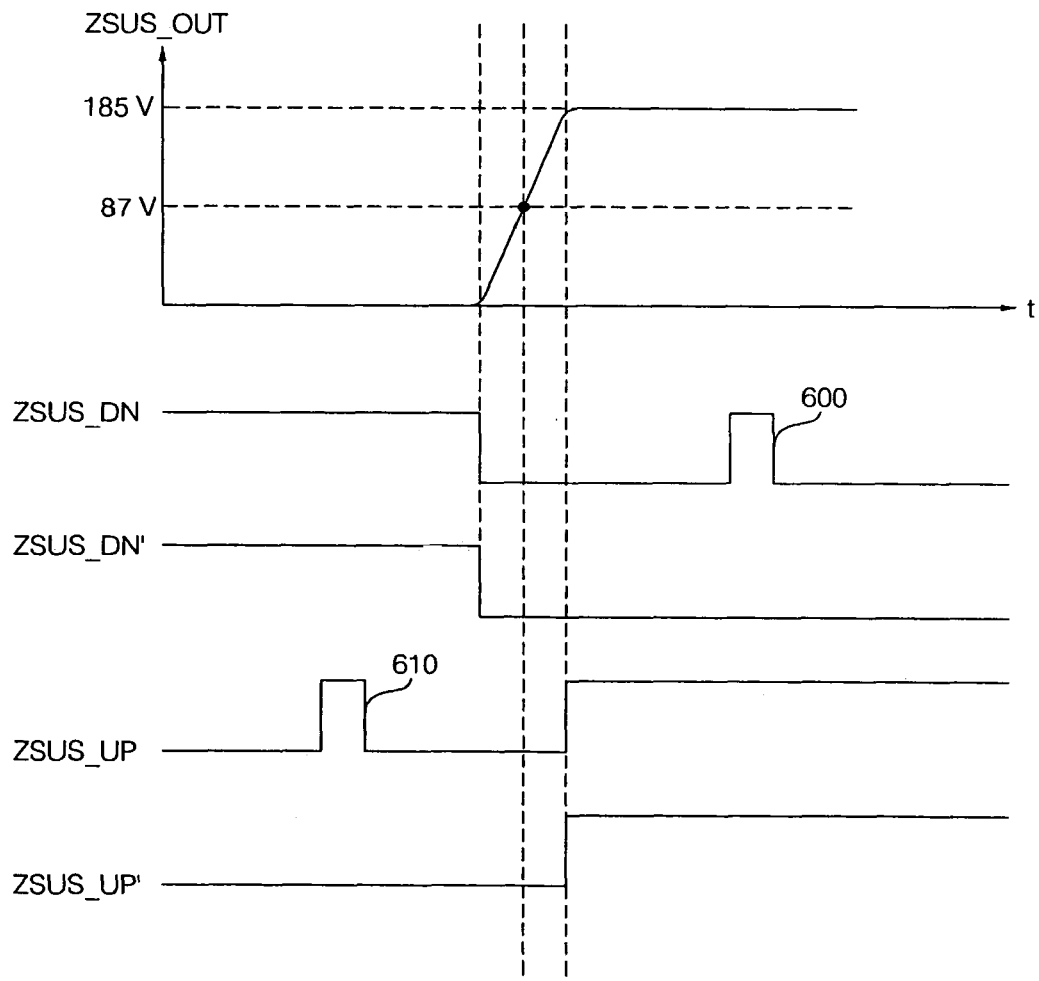
FIG. 10 is a graph showing an embodiment of the operation of the circuit protection unit shown in FIG. 7.

FIG. 10 is a graph showing an embodiment of the operation of the circuit protection unit 320. FIG. 10 shows an example in which the reference voltage V_REF is set to 87 V.

Referring to FIG. 10, when the output voltage ZSUS_OUT of the sustain driving apparatus is higher than the reference voltage, i.e., 87V, the circuit protection unit 320 maintains the driving signal ZSUS_DN' of the fourth switch Q4 to a low level. Accordingly, although the driving signal ZSUS_DN of the fourth switch Q4 is input as a high level (600) when the output voltage ZSUS_OUT is higher than 87V, the circuit protection unit 320 maintains an actual driving signal ZSUS_DN' of the fourth switch Q4 to a low level, thus preventing the fourth switch Q4 from being short.

Furthermore, when the output voltage ZSUS_OUT of the sustain driving apparatus is lower than the reference voltage, i.e., 87V, the circuit protection unit 320 maintains the driving signal ZSUS_UP' of the third switch Q3 to a low level. Accordingly, although the driving signal ZSUS_U of the third switch Q3 is input as a high level (610) when the output voltage ZSUS_OUT is lower than 87V, the circuit protection unit 320 maintains an actual driving signal ZSUS_UP' of the third switch Q3 to a low level, thus preventing the third switch Q3 from being short.

Figure 11:
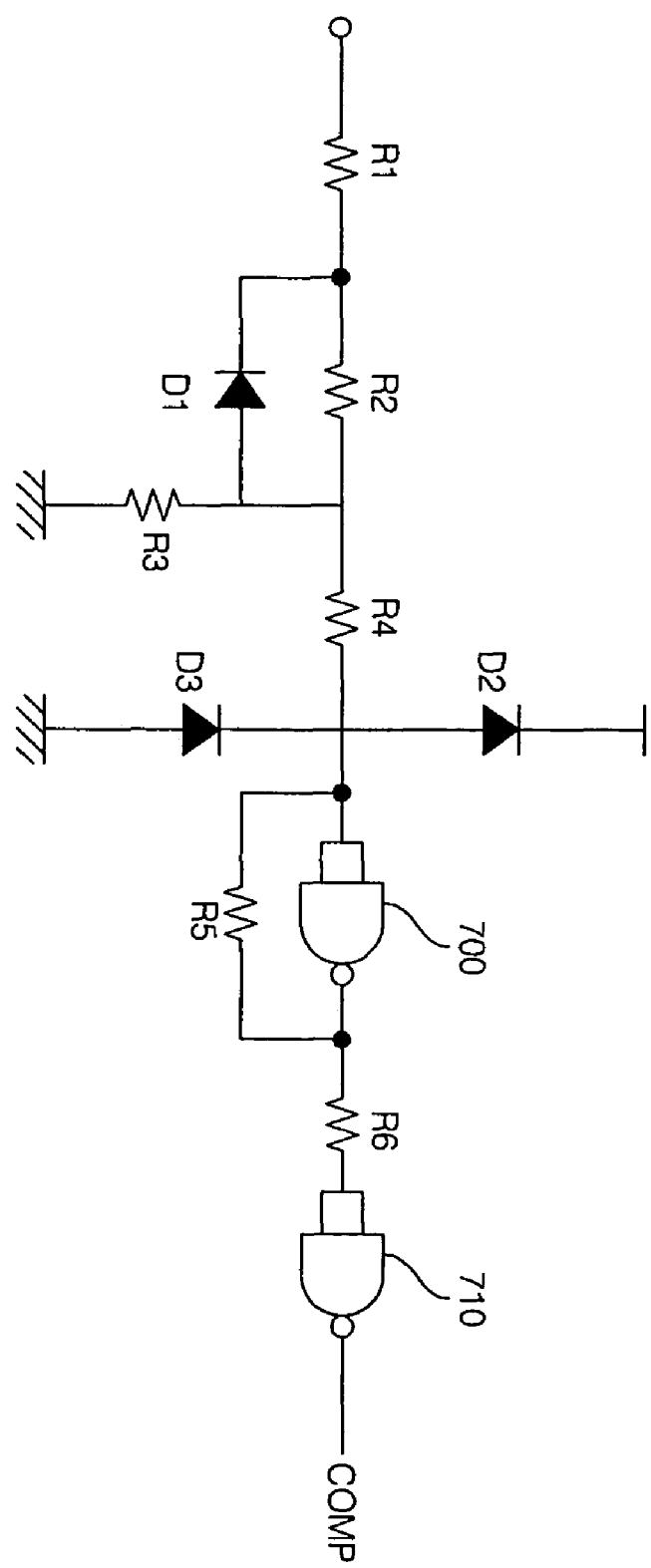
FIG. 11 is a circuit diagram showing an embodiment of the construction of a comparator included in the circuit protection unit shown in FIG. 8.

FIG. 11 is a circuit diagram showing an embodiment of the construction of the comparator included in the circuit protection unit 320. The comparator includes six resistors R1, R2, R3, R4, R5, and R6, three diodes D1, D2, and D3, and two NAND gates 700 and 710.

The two NAND gates 700 and 710 have the same input and have the same function as that of an inverter. Therefore, each of the NAND gates 700 and 710 may consist of an inverter. Furthermore, since each of the NAND gates 700 and 710 has a predetermined threshold voltage Vth, it operates only when a signal having a voltage higher than the threshold voltage Vth is received. Accordingly, only when a voltage higher than 2Vth, which is the sum of the two threshold voltages of the NAND gates 700 and 710, is input to the NAND gate 700, the output value COMP becomes High. Therefore, each of the NAND gates 700 and 710 operates as a comparator using the voltage 2Vth as a reference voltage.

The threshold voltage of the NAND gate is generally in a range of about 2 to 3V. Therefore, the reference voltage of the comparator including the NAND gates 700 and 710 shown in FIG. 11 is within a range of about 4 to 6V. It is preferred that the sustain output voltage ZSUS_OUT be scaled down in line with a reference voltage to be compared and be then input to the NAND gates 700 and 710. It is also preferred that the sustain output voltage ZSUS_OUT be scaled down by voltage division employing the plurality of resistors R1, R2, and R3, as shown in FIG. 11. Furthermore, it is preferred that the first diode D1 be connected, as shown in FIG. 11, in order to reduce delay generated by scale-down.

To advance a rising time and a falling time of the output of the NAND gate 700 and, therefore, to advance trigger, the resistor R5 is preferably connected parallel to the NAND gate 700, as shown in FIG. 11. Furthermore, the resistor R6 is preferably connected between the two NAND gates 700 and 710 in order to reduce chattering noise.

In accordance with the present invention, when a voltage at both ends of the switch included in the sustain driving apparatus in order to supply the sustain signal is higher than a reference voltage, the switch is controlled not to turn on. It is therefore possible to prevent damage due to the short of the sustain driving apparatus and, therefore, to improve the lifespan and reliability of a product.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:
1. A plasma display apparatus, comprising:
   a sustain driver including a first switch for applying a sustain signal to a plasma display panel and a first voltage to the panel, and a second switch for applying a second voltage to the panel;
   a controller that generates a first control signal to control the first switch to apply the sustain signal and a second control signal to control the second switch to apply the second voltage and outputs the first and second control signals to the sustain driver; and a circuit protection unit that prevents the first switch from applying the sustain signal when a voltage level of the sustain signal is less than a third voltage and prevents the second switch from applying the second voltage when the voltage level of the sustain signal is greater than the third voltage, wherein the circuit protection unit includes a comparator that compares the voltage level of the sustain signal and the third voltage, a first inverter that inverts the comparator output signal, a first NAND gate that receives the first inverter output signal and the first control signal as inputs, a second inverter that inverts the first NAND gate output signal and outputs the inverted signal to the first switch, a second NAND gate that receives the second comparator output signal and the second control signal as inputs, and a third inverter that inverts the second NAND gate output signal and outputs the inverted signal to the second switch.

2. The plasma display apparatus of claim 1, wherein the plasma display panel comprises:

a front substrate;

the first and second electrode formed on the front substrate;

a rear substrate;

a third electrode formed on the rear substrate; and barrier ribs formed over the rear substrate, for partitioning a plurality of discharge cells.

3. The plasma display apparatus of claim 1, wherein the third voltage is less than or equal to a ¼ of the sustain voltage.

4. The plasma display apparatus of claim 1, wherein the front substrate includes a first and second electrodes formed thereon, and wherein the circuit protection unit controls the first and second switches to apply the sustain signal according to a voltage level of the sustain signal applied to any one of the first and second electrodes.

5. The plasma display apparatus of claim 1, wherein the circuit protection unit comprises an OP amp for comparing the amount of the sustain signal and the third voltage.

6. The plasma display apparatus of claim 1, wherein the third voltage is set in a range of ¼ to ¾ of a sustain voltage.

7. The plasma display apparatus of claim 1, wherein the circuit protection unit prevents the first switch from applying the sustain signal when a voltage at both ends of the first switch is higher than a fourth voltage, and prevents the second switch from applying the sustain signal when a voltage at both ends of the second switch is greater than a fifth voltage.

8. The plasma display apparatus of claim 1, wherein the circuit protection unit comprises an OP amp for comparing a voltage at both ends of each of the first and second switches and the predetermined voltage.

9. The plasma display apparatus of claim 1, wherein at least one of the first and second switches is a FET (Field Effect Transistor), and the circuit protection unit precludes a voltage input to a gate of the FET when a drain-source voltage of the FET is higher than the predetermined voltage.

10. The plasma display apparatus of claim 1, wherein the comparator comprises:

a fourth inverter that inverts the sustain signal; and a fifth inverter that inverts the fourth inverter output signal, wherein the fourth and fifth inverters have a predetermined threshold voltage.

11. The plasma display apparatus of claim 1, wherein the comparator comprises:

a third NAND gate using the sustain signal as two inputs; and a fourth NAND gate using the third NAND gate output signal as two inputs, wherein the third and four NAND gates have a predetermined threshold voltage.

12. The plasma display apparatus of claim 10, wherein the comparator further comprises a scale adjustment unit that scales down the sustain signal and outputs the resulting signal to the fourth inverter.

13. The plasma display apparatus of claim 10, wherein the comparator further comprises a resistor connected between both ends of the fourth inverter.

14. The plasma display apparatus of claim 10, wherein the comparator further comprises a resistor connected between the fourth inverter and the fifth inverter.

15. The plasma display apparatus of claim 12, wherein the scale adjustment unit comprises:

a plurality of resistors for scaling down the sustain signal; and a diode connected between both ends of at least one of the plurality of resistors.

16. The plasma display apparatus of claim 1, further comprising an energy recovery unit that recovers and stores energy supplied to the panel, wherein the energy recovery unit comprises:

a source capacitor;

third and fourth switches that respectively control energy supply and recovery between the source capacitor and the panel; and an inductor that forms a resonant circuit together with the source capacitor and a capacitor of the panel.

17. The plasma display apparatus of claim 16, wherein the sustain driver further comprises a sustain voltage source that supplies a sustain voltage, and the first switch is turned on after energy is supplied to the panel by the energy recovery unit, so that the first voltage is applied to the panel, and the second switch is turned on after energy is recovered from the panel by the energy recovery unit, so that the second voltage is applied to the panel.

* * * * *